United States Patent
Umeki

[19]

[11] Patent Number: 5,879,972
[45] Date of Patent: Mar. 9, 1999

[54] SRAM DEVICE AND METHOD OF MANUFACTURING THE SAME

[75] Inventor: Mitoshi Umeki, Sagamihara, Japan

[73] Assignee: NKK Corporation, Japan

[21] Appl. No.: 809,800

[22] PCT Filed: Jul. 22, 1996

[86] PCT No.: PCT/JP96/02039

§ 371 Date: Mar. 27, 1997

§ 102(e) Date: Mar. 27, 1997

[87] PCT Pub. No.: WO97/05652

PCT Pub. Date: Feb. 13, 1997

[30] Foreign Application Priority Data

Jul. 13, 1995 [JP] Japan .................................. 7-195569
Jul. 31, 1995 [JP] Japan .................................. 7-195570

[51] Int. Cl.⁶ .................................................. H01L 21/00
[52] U.S. Cl. ..................... 438/153; 438/210; 438/238; 438/682; 257/393
[58] Field of Search .................................. 437/153, 154, 437/155, 210, 213, 238, 275, 279, 382, 649, 682; 257/67, 393, 350

[56] References Cited

U.S. PATENT DOCUMENTS

| | | | |
|---|---|---|---|
| 4,034,243 | 7/1977 | Love et al. | 257/393 |
| 4,794,561 | 12/1988 | Hsu | 438/153 |
| 5,310,694 | 5/1994 | Houston | 438/153 |
| 5,320,975 | 6/1994 | Cederbaum et al. | 438/153 |
| 5,359,226 | 10/1994 | Dejong | 257/393 |
| 5,391,894 | 2/1995 | Itabashi et al. | 257/67 |
| 5,686,736 | 11/1997 | Natsume | 257/393 |

FOREIGN PATENT DOCUMENTS 63-196072 8/1988 Japan .
5-175464 7/1993 Japan .

Primary Examiner—Tuan H. Nguyen
Attorney, Agent, or Firm—Nixon & Vanderhye

[57] ABSTRACT

A gate insulating film is formed on a main surface of a semiconductor substrate. A conductive layer P1 including a gate region G1 and a conductive layer P2 including a gate region G2 are formed on the gate insulating film. A diffusion regions D1, S, and D2 are formed with gate regions G1 and G2 interposed therebetween. The conductive layer P1 and the diffusion region D2 are put in contact with each other and the conductive layer P2 and the diffusion region D1 are put in contact with each other. On the main surface region of the substrate corresponding to the conductive layer P1, a buried diffusion layer BD1 of the same conductive type as the diffusion region S is formed contiguously to the diffusion region S. On the main surface region of the substrate corresponding to the conductive layer P2, a buried diffusion layer BD2 of the same conductive type as the diffusion region S is formed contiguously to the diffusion region S. Then, the diffusion region S is grounded.

3 Claims, 8 Drawing Sheets

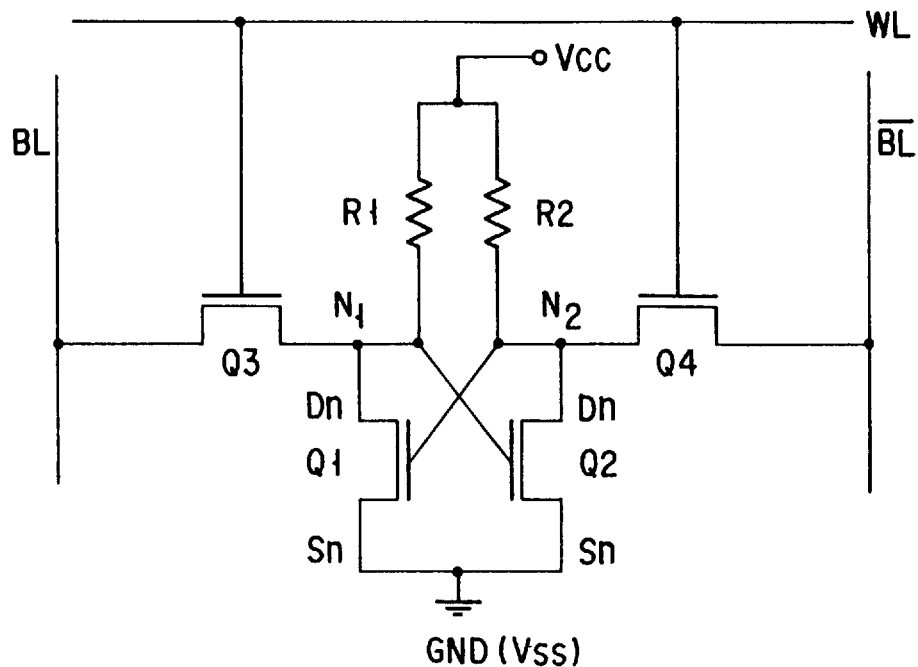
F I G. 1
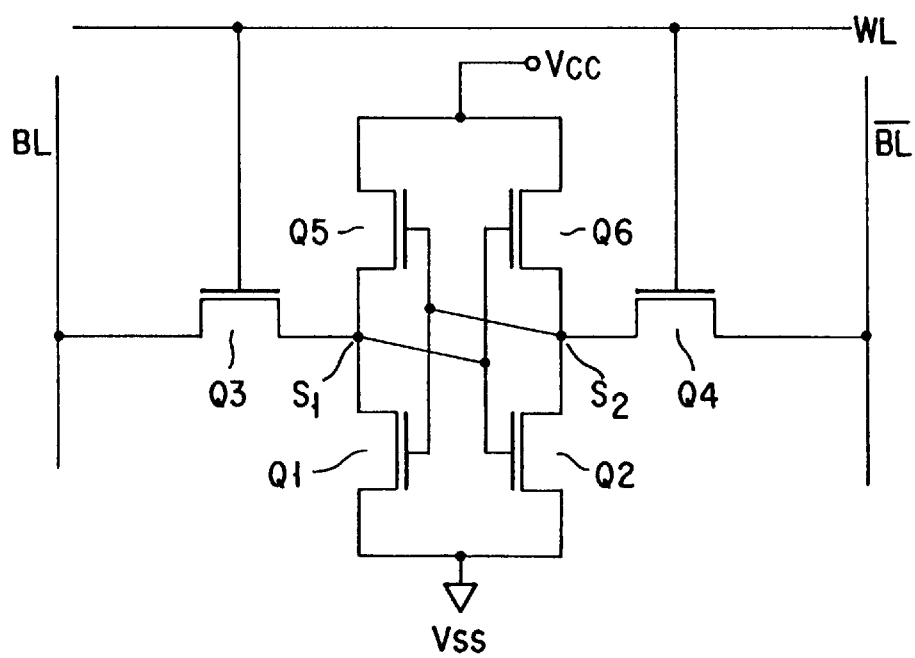
F I G. 2

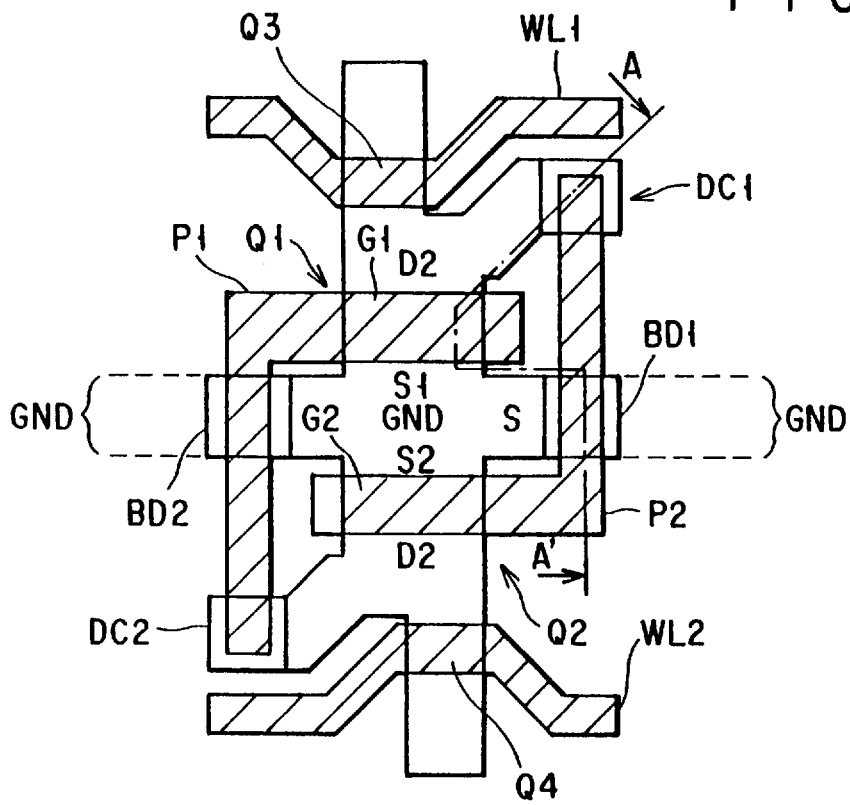
F I G. 3 A
F I G. 3 B
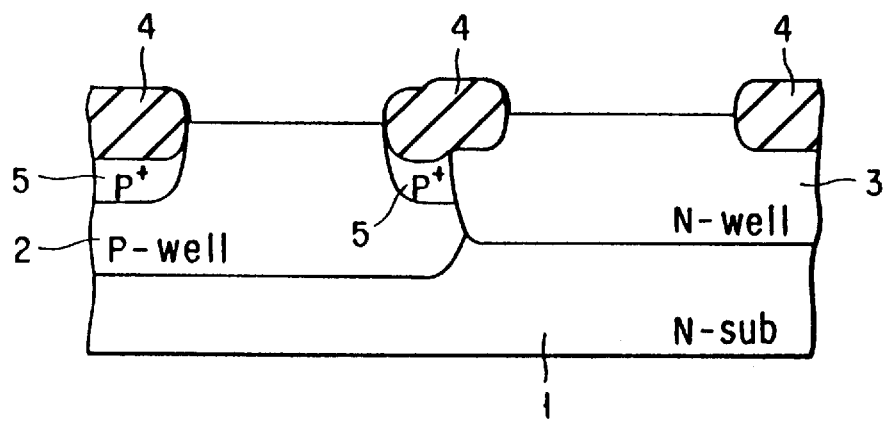
F I G. 4

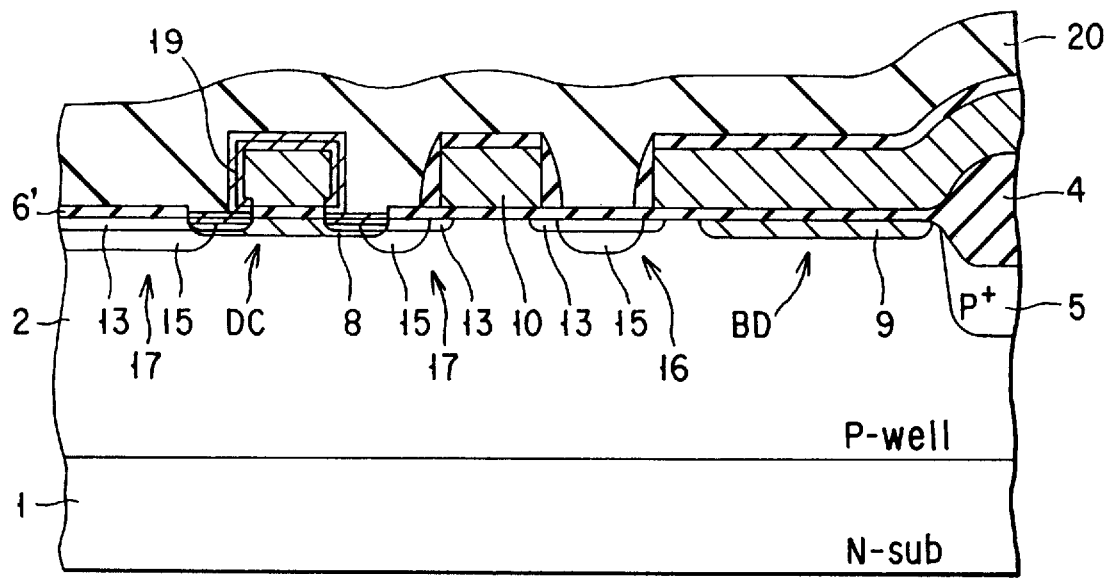
F I G. 14
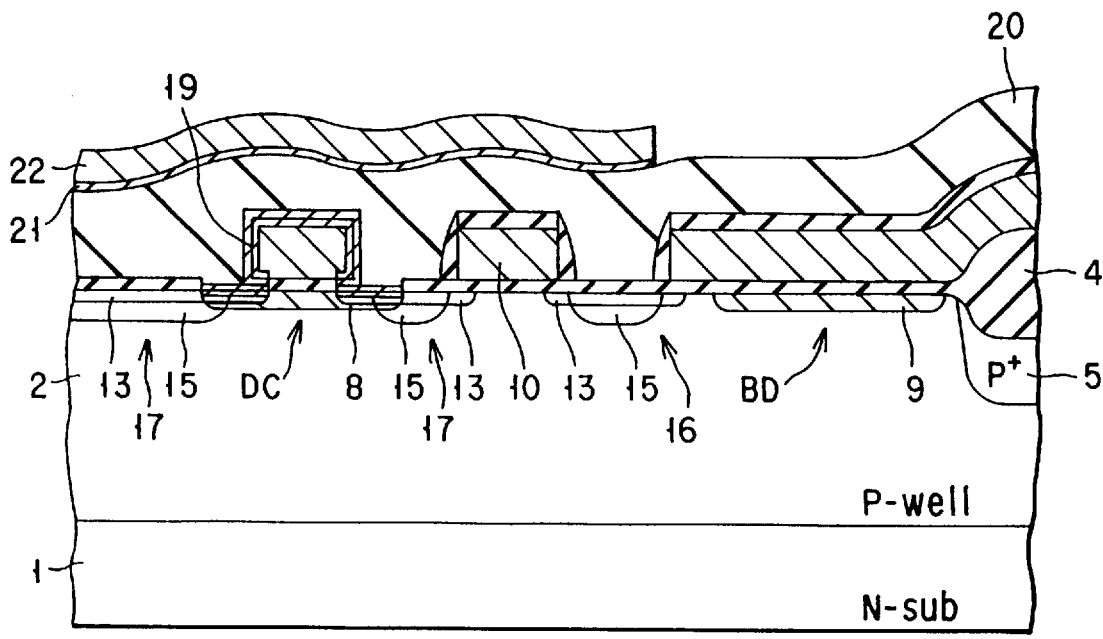
F I G. 15

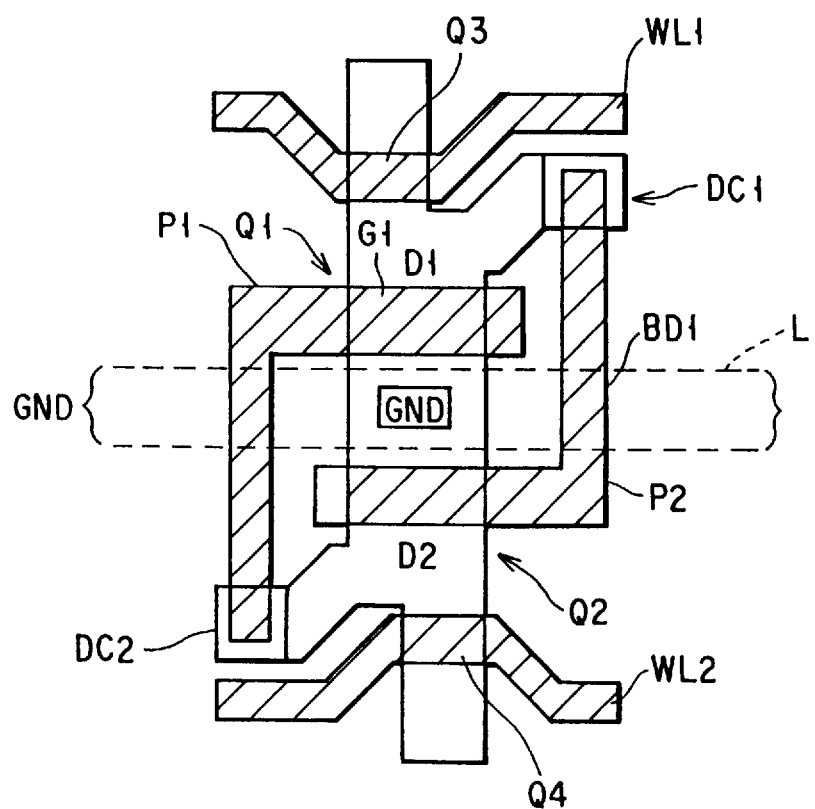
F I G. 18

# SRAM DEVICE AND METHOD OF MANUFACTURING THE SAME

TECHNICAL FIELD

The present invention relates to a SRAM device and a method of manufacturing the same.

BACKGROUND ART

In a static random access memory (SRAM) cell, one-bit is formed by a flip-flop structure. Therefore, the inverter output portion of one transistor is put in contact with the gate of the other transistor. The inverter output portion of the other transistor is put in contact with the gate of the first-mentioned transistor. This is particularly called "coupling".

In manufacturing an LSI, the output portion of the inverter corresponds to the drain portion ($N^+$ diffusion region) of a driver transistor (hereinafter, referred to as "pull-down transistor"). Therefore, the $N^+$ diffusion region must be brought into contact with the gate, to effect coupling.

The direct contact is made as shown in FIG. 18. A polysilicon layer P1 for forming a gate G1 of a transistor Q1 extends to the proximity of a drain D2 of a transistor Q2 and comes into contact with the drain D2, and a polysilicon layer P2 of the transistor Q2 extends, in a similar fashion, to the proximity of a drain D1 of the transistor Q1. As a result, a source S serving as a ground electrode is surrounded by polysilicon layers. Therefore, another layer must be provided for the formation of the ground wiring L. That is, an additional polysilicon layer or an extra silicide layer ($TiSi_2$, WSi) is further required.

For making the coupling, the following conventional methods are known: (1) coupling is made by a second polysilicon layer and not by a first polysilicon layer forming the gate, and (2) coupling is made by a direct contact of the gate polysilicon of one transistor and the N+ diffusion region of the other transistor.

In the method (1), after completion of a source/drain formation step by means of a CMOS process, an insulating film is removed from the gate polysilicon of one transistor and from the $N^+$ diffusion region of the other transistor, and then, a Ti silicide layer is formed thereon. Subsequently, a second polysilicon layer is formed on the resultant structure. By way of the second polysilicon layer thus formed, the gate polysilicon of one transistor is coupled with the $N^+$ diffusion region of the other transistor.

However, this method has a drawback. Since three masks are required, the manufacturing process becomes complicated. Furthermore, to form contact on the gate polysilicon, the gate polysilicon must be overlapped with a contact pattern, increasing a cell size. To prevent the enlargement of the cell-size, a technique such as self-align contact is required. If so, the manufacturing steps will further increase, complicating the manufacturing process. Furthermore, this method requires to form two types of contacts. Therefore, the process corresponding to each of ohmic contacts must be controlled.

In the method (2), after the gate oxide film is removed from the contact formation portion of a substrate, a gate polysilicon layer is formed. Subsequently, phosphorus glass is deposited on the gate polysilicon layer and heat treatment is applied to the resultant structure. As a result, phosphorus is diffused not only into the polysilicon layer but also into the contact formation region of the substrate. In this manner, the direct contact of gate polysilicon with the $N^+$ diffusion region can be attained.

However, this method has a drawback. Since phosphorus is doped by means of heat diffusion, the phosphorus-diffusion region becomes as large as 0.5 to 1.2 $\mu$m. Hence the device thus obtained cannot be used as a submicron device.

DISCLOSURE OF INVENTION

An object of the present invention is to provide a SRAM device capable of forming a ground wiring without providing an additional layer and to provide a method of manufacturing the SRAM device.

Another object of the present invention is to provide a method of coupling the gate of one driving transistor to the diffusion region of the other transistor in a semiconductor device having a SRAM structure without preventing miniaturization and without complicating the manufacturing process.

According to a first aspect of the present invention, there is provided a SRAM device comprising: a semiconductor substrate and a plurality of memory cells formed on the semiconductor substrate, each of the memory cells being formed on a main surface of said semiconductor substrate and comprising:

first, second, and third diffusion regions serving as a source region or a drain region;

a first conductive layer including a first gate region, formed on a channel region between the first diffusion region and the second diffusion region, with an insulating layer interposed;

a second conductive layer including a second gate region, formed on a channel region between the second diffusion region and third diffusion region, with an insulating layer interposed;

a first contact region in which the first conductive layer is in contact with the third diffusion region;

a second contact region in which the second conductive layer is in contact with the first diffusion region, the first diffusion region and the third diffusion region being mutually opposed with the second diffusion region interposed therebetween, and the first conductive layer and second conductive layer being positioned so as to surround the second diffusion region;

a first buried diffusion layer of the same conductive type as the second diffusion region formed on a main surface region of the substrate corresponding to the first conductive layer, contiguously to the second diffusion region; and a second buried diffusion layer of the same conductive type as the second diffusion region formed on a main surface region of the substrate corresponding to the second conductive layer, contiguously to the second diffusion region;

wherein a first driving transistor is formed of the first diffusion region, second diffusion region and the first conductive layer serving as a gate region; and a second driving transistor is formed of the second conductive region, the third diffusion region and the second conductive layer;

each of memory cells includes the first and second driving transistors;

the second diffusion region is grounded; and each of the first and second buried diffusion layers is connected to a grounded diffusion region of an adjacent memory cell, thereby forming a common ground wiring.

According to a second aspect of the present invention, there is provided a method of manufacturing a SRAM device, comprising the steps of:

forming a gate insulating film on a main surface of a semiconductor substrate;

forming a first conductive layer including a first gate region on the gate insulating film;

forming a second conductive layer including a second gate region;

forming first, second, and third diffusion regions serving as a source or drain region, with the first gate region and the second gate region interposed;

bringing the first conductive layer in contact with the third diffusion region;

bringing the second conductive layer in contact with the first diffusion region;

forming a first buried diffusion layer of the same conductive type as the second diffusion region on a main surface of a substrate corresponding to the first conductive layer, in a contiguous form to the second diffusion region;

forming a second buried diffusion layer of the same conductive type as the second diffusion region on the main surface of a substrate corresponding to the second conductive layer, in a contiguous form to the second diffusion region; and grounding the second diffusion region.

According to a third aspect of the present invention, there is provided a method of coupling a conductive layer serving as a gate of one of two driving transistors with a diffusion region of the other transistor in a semiconductor device of a SRAM structure having two driving transistors mounted on a semiconductor substrate, the method comprises the steps of:

forming an gate insulating film on a main surface of the semiconductor substrate;

forming a buried diffusion layer of the same conductive type as the diffusion region to be coupled, by injecting impurities through the insulating film into the predetermined contact formation region of a main surface of the semiconductor substrate;

forming a conductive layer serving as a gate on a portion of the gate insulating film corresponding to the buried diffusion layer;

forming the diffusion region to overlap with the buried diffusion layer;

removing part of the insulating layer between the conductive layer and the buried diffusion layer; and bringing the conductive layer in contact with the buried diffusion layer by providing a conductive material around the conductive layer.

In the first and second aspects mentioned above, on the basis of the prerequisite conditions that the first conductive layer and the third diffusion region are in contact with each other and the second conductive layer and the first diffusion region are in contact with each other, a first buried diffusion layer of the same conductive type as the second diffusion region is formed, on the main surface of a substrate corresponding to the first conductive layer, contiguously to the second diffusion region. Furthermore, a second buried diffusion layer of the same conductive type as the second diffusion region is formed on the main surface of a substrate corresponding to the second conductive layer, contiguously to the second diffusion region. The second diffusion region is grounded. Each of the first and second buried diffusion layers is in contact with a grounded diffusion region of an adjacent memory cell. Therefore, a common ground wiring can be formed in the diffusion region on the main surface of a substrate. On other words, the ground wiring can be formed without providing an additional layer.

In the third aspect of the present invention, since the buried diffusion layer is previously formed in the predetermined contact formation region of the main surface of a semiconductor substrate by ion implantation through an insulating layer, the impurity diffusion region will not be broader than required, unlike a conventional case of a direct contact. Furthermore, part of the insulating layer between the buried diffused layer and the conductive layer is removed and a conductive material is buried in the insulating layer removed portion, thereby putting the buried diffusion layer in contact with the conductive layer. In this way, coupling is accomplished. Therefore, the manufacturing steps are simplified compared to a conventional case employing a second polysilicon layer. Furthermore, the contact portion may be formed in a smaller size.

BRIEF DESCRIPTION OF DRAWINGS

FIG. 1 is an equivalent circuit diagram of a SRAM device of a high-resistance loading type to be applied to the present invention;

FIG. 2 is an equivalent circuit diagram of a SRAM device of a thin-transistor loading type to be applied to the present invention;

FIG. 3 is a schematic plan view of a SRAM device according to an embodiment of the present invention;

FIG. 4 is a view of a substrate for a SRAM device, to which a P-well region and an N-well region are provided;

FIGS. 5 to 17 are cross sectional views for use in explaining the manufacturing steps of a SRAM; and FIG. 18 is a schematic plan view of a conventional SRAM device.

BEST MODE OF CARRYING OUT THE INVENTION

Figure 5:
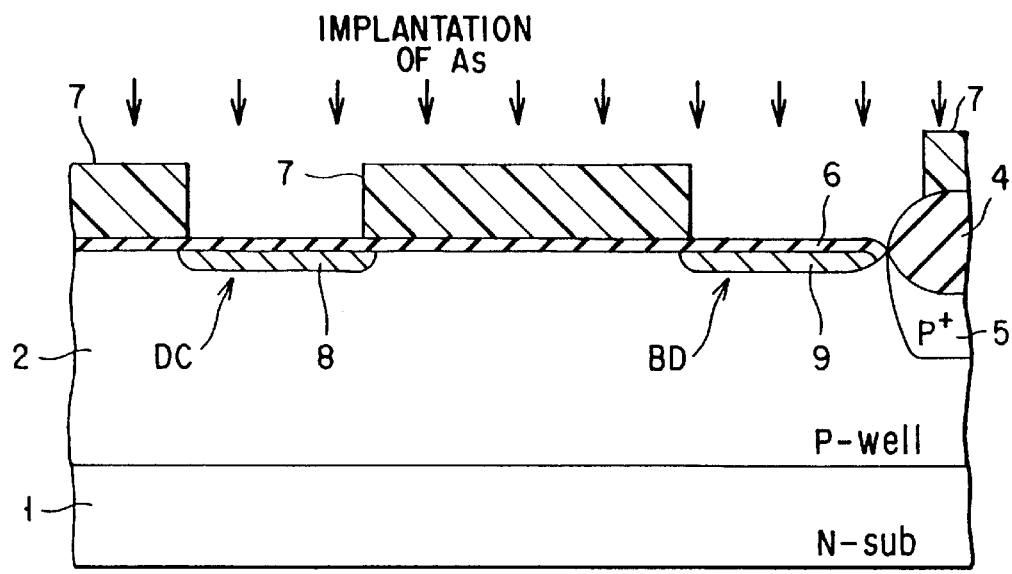

Hereinbelow, embodiments of the present invention will be explained.

As the SRAM device used in the present invention, either a SRAM of a high-resistance loading type shown in the equivalent circuit diagram of FIG. 1 or a SRAM of a thin-film transistor (TFT) loading type may be used.

The high-resistance-loading type SRAM shown in FIG. 1 comprises four transistors $Q_1$–$Q_4$ and two high-resistances $R_1$ and $R_2$. In FIG. 1, $Q_1$ and $Q_2$ are pull-down transistors. $Q_3$ and $Q_4$ are transfer-gate transistors (hereinafter, referred to as "pass- gate transistor"). WL is a word line, BL and BL are bit lines. $N_1$ and $N_2$ are nodes, and Vcc is a positive-side power source voltage, Vss is a negative-side power source voltage.

Now, we will explain how to operate the high-resistance-loading type SRAM shown in FIG. 1.

The transistor Q2 is in the on-state and the transistor Q1 is in the off-state. At the node $S_1$, if the transistor Q1 is off and the high-resistance-load has a sufficiently higher resistance value than that of the transistor, the potential can be maintained at 5 V. At the node $S_2$, if the transistor Q2 is on and the high resistance load has a sufficiently lower resistance value than that of the transistor, the potential can be maintained at 0 V. However, under the aforementioned conditions, a direct current flows from the positive-side power source voltage (Vcc) supply line to the negative-side power source voltage (Vss) supply line, by way of the node $S_2$. The value of the direct current is inversely proportional to the value of the high resistance load $R_2$.

The SRAM of a TFT loading type shown in FIG. 2 comprises four transistors $Q_1$ to $Q_4$, similarly to FIG. 1, and two TFT loading high-resistances $Q_5$ and $Q_6$. In FIG. 2, WL represents a word line. BL and $\overline{BL}$ are bit lines. N1 and N2 are nodes. Vcc is a positive-side power source voltage. Vss is a negative-side power source voltage.

Now, we will explain how to operate the TFT-loading-type SRAM. If the positive-side power source voltage Vcc is set to 5 V and the negative power source voltage Vss is set to 0 V, the node N1 becomes 5 V and the node N2 becomes 0 V. In this case, the transistor Q2 is on and transistor Q6 is off, at the same time, the transistor Q1 is off and transistor Q5 is on. At the node $N_1$, if the transistor Q1 is off and a resistance value of the transistor Q1 is sufficiently higher than that of the on-state transistor Q5, the potential can be maintained at 5 V. At the node $N_2$, if the transistor Q2 is on and the resistance value thereof is sufficiently lower than that of the off-state transistor Q6, the potential can be maintained at 0 V.

Hereinbelow, we will explain a gist portion of the SRAM device according to an embodiment of the present invention. FIG. 3 is a schematic plan-view showing the gist portion. The SRAM device comprises a first pull-down transistor Q1, a second pull-down transistor Q2, a first pass-gate transistor Q3, and a second pass-gate transistor Q4. The SRAM device further comprises first and second load elements (not shown) constituted of a high-resistance-loading transistor or a TFT transistor. One memory cell is constructed of these six elements. (cell A shown in FIG. 3 is explained herein).

In the memory cell, a source S1 and a drain D1 of a first pull-down transistor Q1, and a source S2 and a drain D2 of a second pull-down transistor Q2 are formed as diffusion regions on the main surface of the substrate. Note that the sources S1 and S2 are formed in common, constituting a source S.

On the main surface of the substrate, a polysilicon layer P1 for forming a gate G1 of the transistor Q1 and a polysilicon layer P2 for forming a gate G2 of the transistor Q2 are formed. The polysilicon layer P1 extends to the proximity of the drain (diffusion region) D2 of the transistor Q2 and comes into direct contact with the main surface of the substrate at a direct contact portion DC2. The direct contact portion DC2 is connected to drain D2. As a result, the gate G1 of the transistor Q1 is coupled with the drain D2 of the transistor Q2.

Note that the polysilicon layers P1 and P2 are simultaneously formed in a single step.

Buried diffusion layers BD1 and BD2 of the same conductive type as the source region are formed adjacent to the source regions S1 and S2 grounded and positioned immediately under the polysilicon layers P1 and P2. With this structure, the source region can be formed contiguously to buried diffusion layers BD1 and BD2.

Adjacent to a memory cell A explained herein, a cell B and a cell C having the same structure are formed. If these buried diffusion layers BD1 and BD2 are formed contiguously to the source regions of the cell B and the cell C, respectively, the resultant structure can be used as a common ground wiring. Hence, an additional layer is not required for grounding.

In the figure, WL1 is an upper word line and WL2 is a lower word line. Both are formed of the same layer as the polysilicon layers P1 and P2.

Hereinbelow, we will explain the steps of manufacturing the SRAM device having the aforementioned structure with reference to FIGS. 4 to 17. Note that a resistance load element is also omitted from the figures.

According to a commonly-used method, at first, a P-well region 2 and an N-well region 3 are formed in an N-type substrate 1 as shown in FIG. 4. Then, to separate these elements, a field oxide film 4 and a p-type region 5 are formed.

In the following steps, only a memory portion will be explained which is directly related to the present invention. Note that FIGS. 5 to 17 are cross sectional views taken along the line A-A' of FIG. 3.

As shown in FIG. 5, a pregate oxide film 6 is formed on the main surface of the P-well region 2, by thermal oxidation. Subsequently, p-type impurities such as boron are doped, effecting channel doping. Then, a resist 7 serving as a photo-mask is formed on the region excluding the direct contact formation regions DC and BD explained in FIG. 3. Thereafter, N-type impurities such as As are doped into the regions DC and BD through the gate oxide film 6. In this case, the accelerating voltage is set to 100 KeV, and the dosage is set to $4 \times 10^{15}$.

By doping the N-type impurities, N-type buried diffusion layers 8 and 9 are formed under the oxide film in the regions DC and BD.

The depths of the buried diffusion layers 8 and 9 are as sufficiently small as at most 0.2 $\mu$m. The buried diffusion layer 8 is used for the aforementioned direct contact (the details will be described later). The buried diffusion layer 9 is used for the formation of the ground wiring, as mentioned above.

Figure 6:
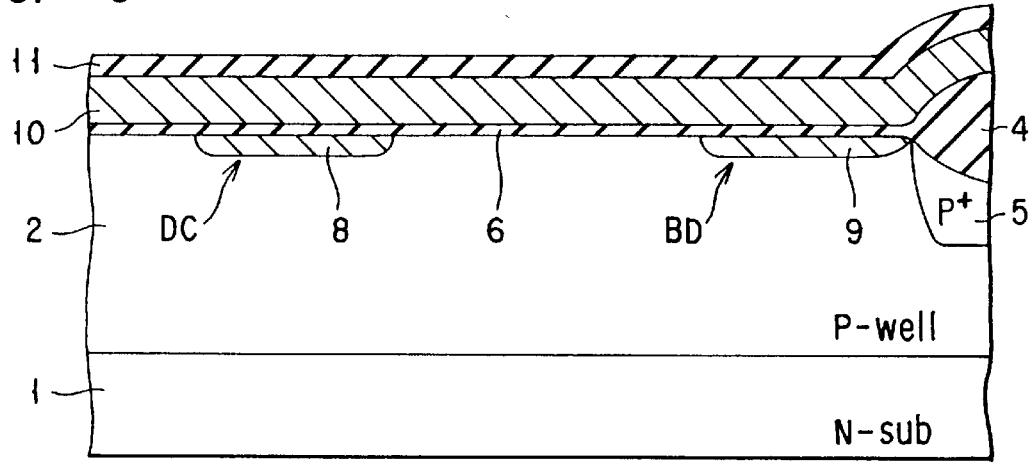

Thereafter, the pregate oxide film 6 is subjected to gate oxidation to provide a gate oxide film 6', as shown in FIG. 6, and then, a polysilicon film 10 is deposited on the gate oxide film 6'. On the polysilicon layer 10, a phosphorus glass layer is formed and treated with heat treatment. In this manner, phosphorus is diffused in the polysilicon layer 10. After the phosphorus glass is removed, the polysilicon layer 10 is subjected to post oxidation. As a result, a $SiO_2$ layer 11 is formed on the polysilicon layer 10.

Figure 7:
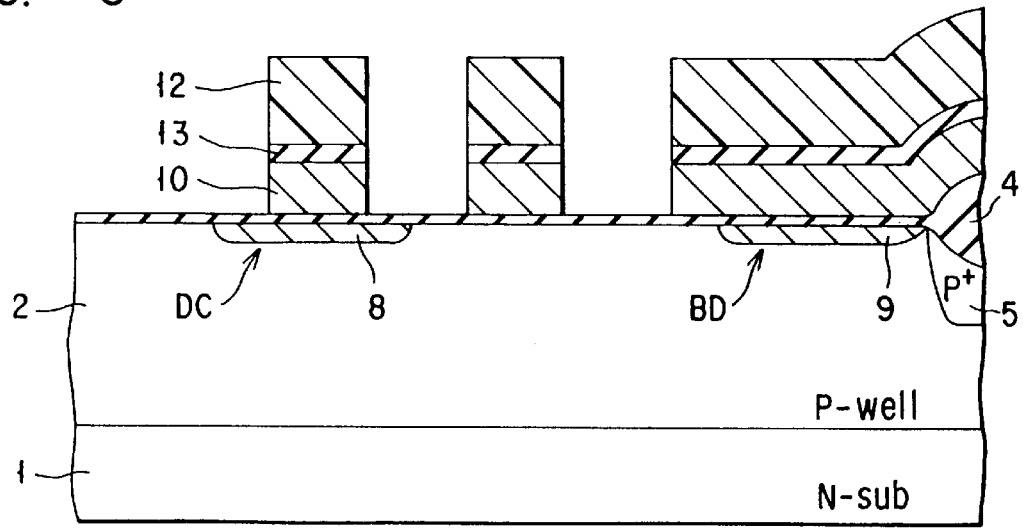

Then, as shown in FIG. 7, a resist film 12 serving as a photo-mask having a predetermined pattern is formed on a $SiO_2$ layer 11. The $SiO_2$ layer 11 and the polysilicon layer 10 are etched. As a result, the polysilicon layer 10 including the gate is patterned in the predetermined form.

Figure 8:
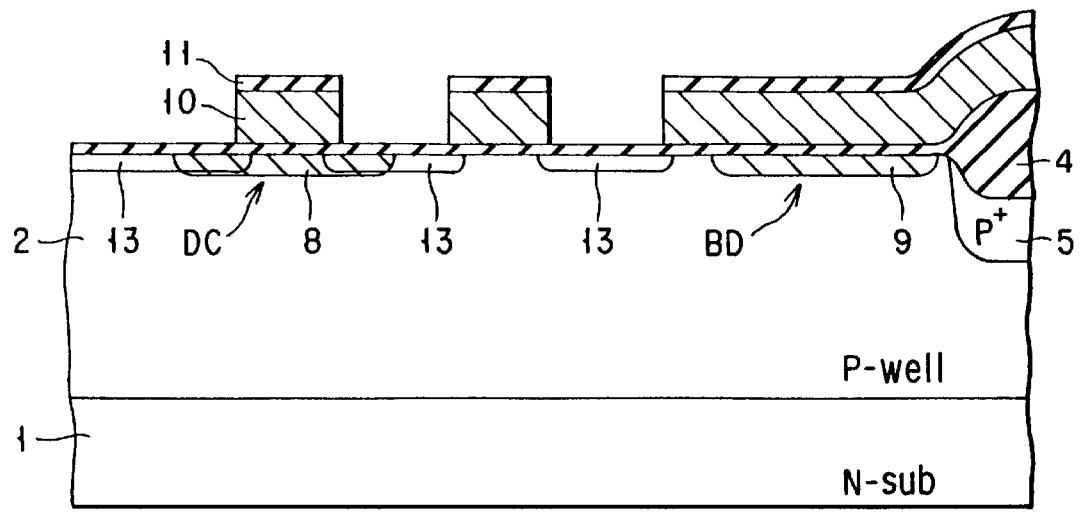

Furthermore, as shown in FIG. 8, to the portion of the resultant structure on which the polysilicon layer 10 is not formed, N-type impurities are doped at a low concentration to form a shallow $N^-$ LDD region 13.

Figure 9:
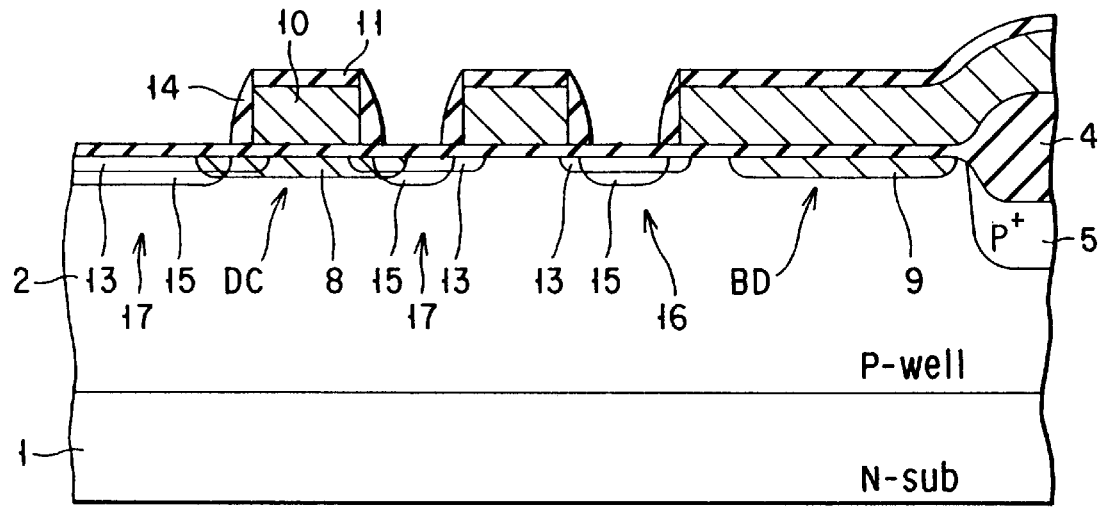

Subsequently, a side wall $SiO_2$ 14 is formed as shown in FIG. 9 and the etching-back of the oxide film is effected. Thereafter, N-type impurities such as As are doped at a high concentration to form a source/drain. In this manner, the $N^+$ region 15 is formed relatively deeper, providing, source/drain regions 16 and 17 having an LDD structure.

Figure 10:
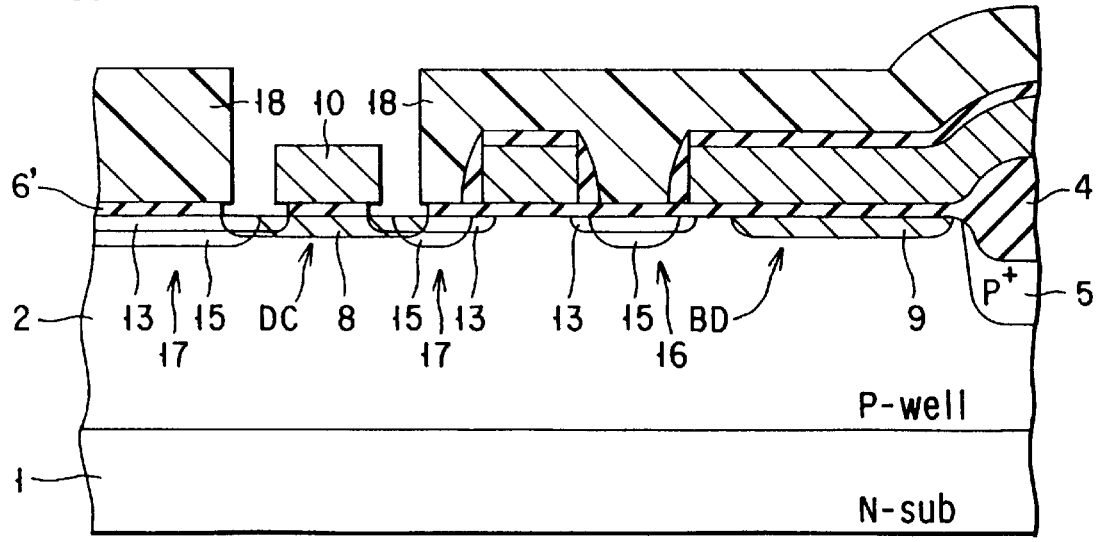
Figure 11:
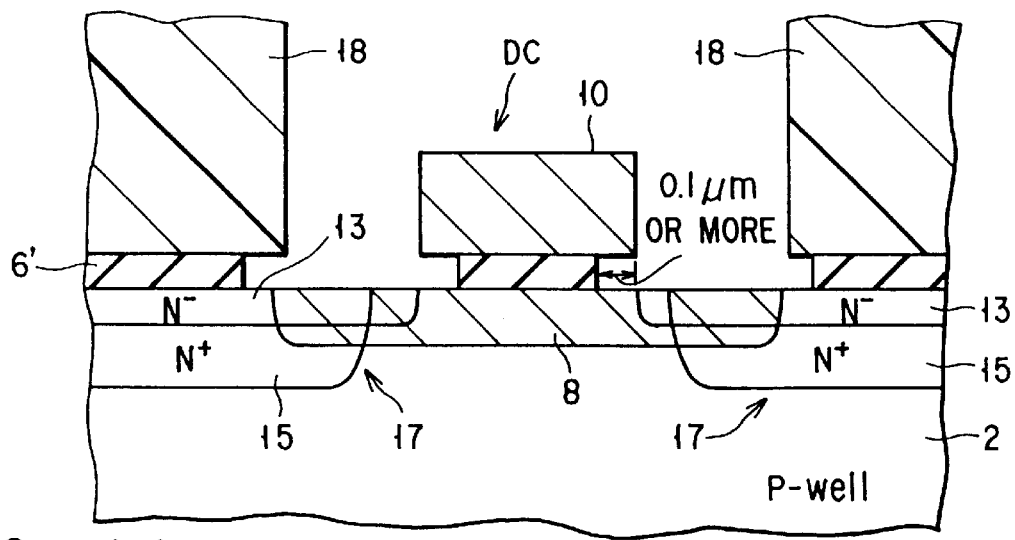

Thereafter, as shown in FIG. 10, the oxide layer of the polysilicon layer 10 in the direct contact region DC is removed by etching, using a resist 18 as a mask. In the region DC, as shown in the enlarged view of FIG. 11, a $SiO_2$ layer 11 formed on the polysilicon layer 10 and the side wall $SiO_2$ 14 are completely removed. The gate oxide film 6' immediately under the polysilicon layer 10 is removed from the both ends of the polysilicon layer 10 by 0.1 $\mu$m or more in length.

Figure 12:
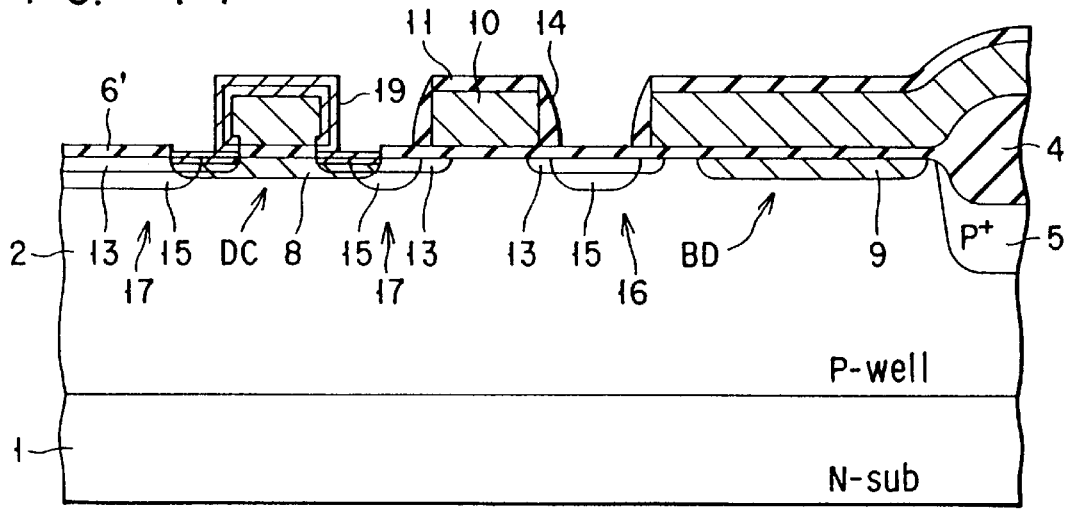

As shown in FIG. 12, titanium is deposited on the region DC and heat is applied thereto, thereby forming a titanium silicide ($TiSi_2$) region 19. Thereafter, titanium attached on the outside is removed. W may be deposited in place of Ti to form WSi.

Figure 13:
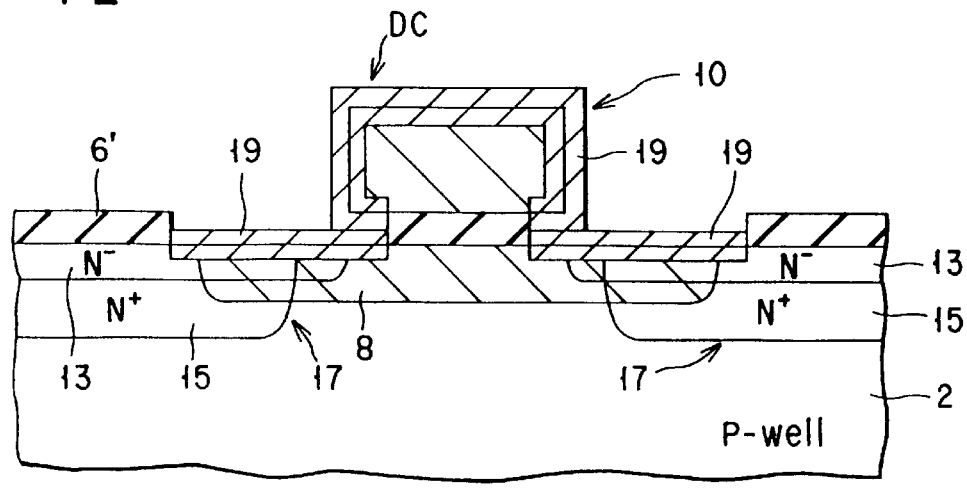

The structure of this step is shown in the enlarged view of FIG. 13. As shown in FIG. 13, the TiSi$_2$ region 19 is also formed between the polysilicon layer 10 and the buried diffusion layer 8. By the presence of the TiSi$_2$ region thus formed, the polysilicon layer 10 can be brought into direct contact with the buried diffusion layer 8 without other polysilicon layer interposed therebetween.

An interlayer insulating film 20 is formed as shown in FIG. 14. The interlayer insulating film 20 is formed by depositing, for example, NSG and then BPSG, followed by subjecting to densify treatment.

As a next step, a desired contact hole (not shown) is formed by contact etch, and tungsten is deposited in the contact hole thus formed, thereby accomplishing etching back.

Thereafter, as shown in FIG. 15, a barrier metal layer 21 are deposited on the interlayer insulating layer 20. On the resultant structure, a first metal layer 22 (for example, formed of aluminium) serving as a lower word line is deposited. Afterwards, unnecessary portions are removed by etching.

Figure 16:
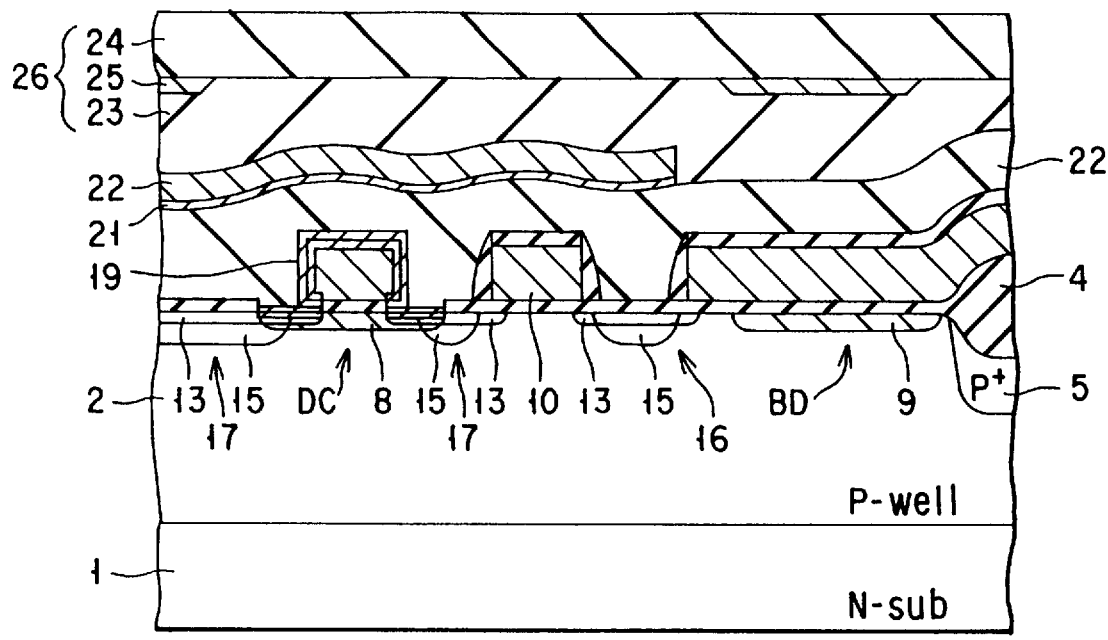

Over the entire surface of the resultant structure, an oxide film is formed. The oxide film is not particularly limited. As the oxide film, used herein is an intermetal oxide layer 26 formed of two oxide films 23 and 24 with a metal layer 25 such as SOG interposed therebetween, as shown in FIG. 16.

Figure 17:
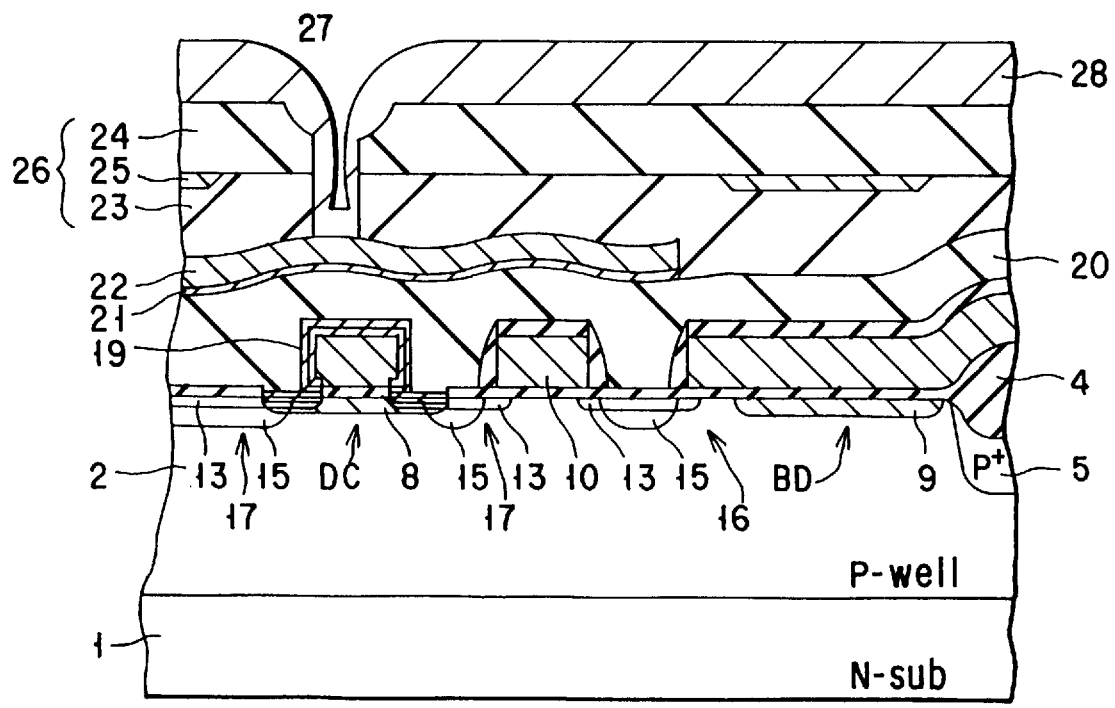

Thereafter, as shown in FIG. 17, the oxide films 23 and 24 are etched to form a via hole 27 reaching the first metal layer 22. In the via hole 27 and on the oxide film 24, a second metal layer 28 (for example, formed of aluminium) serving as an upper word line is formed. Note that the first metal layer 22 is communicated with the second metal layer 28 by way of the via hole 27.

Afterwards, an oxide film and a nitride film are formed on the resultant structure, as needed, and then subjected to desired treatment. In this way, the SRAM device is accomplished.

In the SRAM device having such a structure, the buried diffusion layer 9 of the same conductive type as the diffusion region (source) 16 is formed on the main surface portion of the substrate corresponding to the conductive layer 10, contiguously to the diffusion region 16. The buried diffusion layer 9 is further connected contiguously to the diffusion regions of the memory cells adjacent thereto. As a result, a common ground wiring can be formed on the main surface of the substrate. Therefore, a ground wiring is formed without providing an additional layer.

To bring the drain region 17 into contact with the polysilicon layer 10 extended from a gate of another transistor in the manufacturing process of the SRAM, the buried diffusion layer 8 is previously formed by ion implantation on the predetermined contact formation region with the insulating layer interposed. As a result, an impurity-diffusion region will not be broader than required, unlike a conventional direct-contact formation case. Therefore, a fine pattern can be sufficiently formed in this case. Furthermore, the polysilicon layer 10 is brought into direct contact with the buried diffusion layer 8 without a second polysilicon layer interposed by providing TiSi$_2$ around the polysilicon layer 10 in the predetermined contact formation region DC. Hence, the manufacturing steps are simplified and the contact portion may be smaller, compared to the case of employing a second polysilicon layer.

The buried diffusion layer 8 is overlapped with the drain 17, with the result that the polysilicon layer 10 becomes in couple with the drain 17 by way of the buried diffusion layer 8.

In the explanation above, polysilicon was used as the conductive layer. However, the conductive layer is not limited to polysilicon, and other materials such as a silicide and an amorphous silicon may be used. Furthermore, TiSi$_2$ or Wsi was employed as the conductive material to be provided around the conductive layer. However, the conductive material is not limited to them. Other conductive materials may be used. Furthermore, the SRAM device is not limited to an N-channel semiconductor. A P-channel semiconductor is also applicable.

I claim:

1. A SRAM device comprising a semiconductor substrate and a plurality of memory cells formed on said semiconductor substrate, each of said memory cells being formed on a main surface of said semiconductor substrate and comprising:

first, second, and third diffusion regions serving as a source region or a drain region;

a first conductive layer including a first gate region, formed on a channel region between the first diffusion region and the second diffusion region, with an insulating layer interposed;

a second conductive layer including a second gate region, formed on a channel region between the second diffusion region and third diffusion region, with an insulating layer interposed;

a first contact region in which said first conductive layer is in contact with said third diffusion region;

a second contact region in which said second conductive layer is in contact with said first diffusion region;

said first diffusion region and said third diffusion region being mutually opposed with said second diffusion region interposed therebetween, and said first conductive layer and second conductive layer being positioned so as to surround said second diffusion region;

a first buried diffusion layer of the same conductive type as the second diffusion region formed on a main surface region of the substrate corresponding to said first conductive layer, contiguously to said second diffusion region; and A second buried diffusion layer of the same conductive type as the second diffusion region formed on a main surface region of the substrate corresponding to said second conductive layer, contiguously to said second diffusion region, wherein a first driving transistor is formed of said first diffusion region, second diffusion region and said first conductive layer serving as a gate region; and a second driving transistor is formed of said second conductive region, said third diffusion region and said second conductive layer;

said each of memory cells includes said first and second driving transistors;

said second diffusion region is grounded; and each of said first and second buried diffusion layers is connected to a grounded diffusion region of an adjacent memory cell, thereby forming a common ground wiring.

2. A method of manufacturing a SRAM device, comprising the steps of:

forming a gate insulating film on a main surface of a semiconductor substrate;

forming a first conductive layer including a first gate region on said gate insulating film;

forming a second conductive layer including a second gate region;

forming first, second, and third diffusion regions serving as a source or drain region, with said first gate region and said second gate region interposed;

bringing said first conductive layer in contact with said third diffusion region;

bringing said second conductive layer in contact with said first diffusion region;

forming a first buried diffusion layer of the same conductive type as the second diffusion region on a main surface of a substrate corresponding to said first conductive layer, in a contiguous form to said second diffusion region;

forming a second buried diffusion layer of the same conductive type as the second diffusion region on a main surface of a substrate corresponding to said second conductive layer, in a contiguous form to said second diffusion region; and grounding said second diffusion region.

3. A method of coupling a conductive layer serving as a gate of one of two driving transistors with a diffusion region of the other transistor in a semiconductor device of a SRAM structure having two driving transistors mounted on a semiconductor substrate, the method comprises the steps of:

forming an gate insulating film on a main surface of said semiconductor substrate;

forming a buried diffusion layer of the same conductive type as said diffusion region to be coupled, by injecting impurities through said gate insulating film into the predetermined contact formation region of a main surface of said semiconductor substrate;

forming a conductive layer serving as a gate on a portion of said gate insulating film including a portion corresponding to said buried diffusion layer;

forming said diffusion region to overlap with said buried diffusion layer;

removing part of said insulating film between said conductive layer and said buried diffusion layer; and bringing said conductive layer in contact with said buried diffusion layer by providing a conductive material around said conductive layer.

\* \* \* \* \*